SEMICONDUCTOR DEVICE HAVING CONTROLLABLE NOISE CHARACTERISTICS
Filed Jan. 20, 1966 2 Sheets-Sheet 1
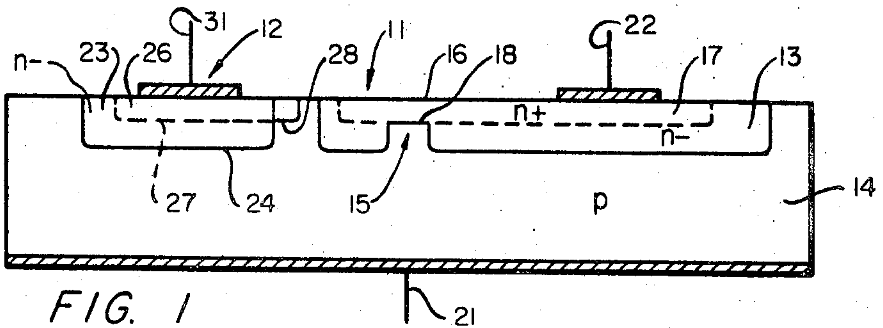
FIG. 1
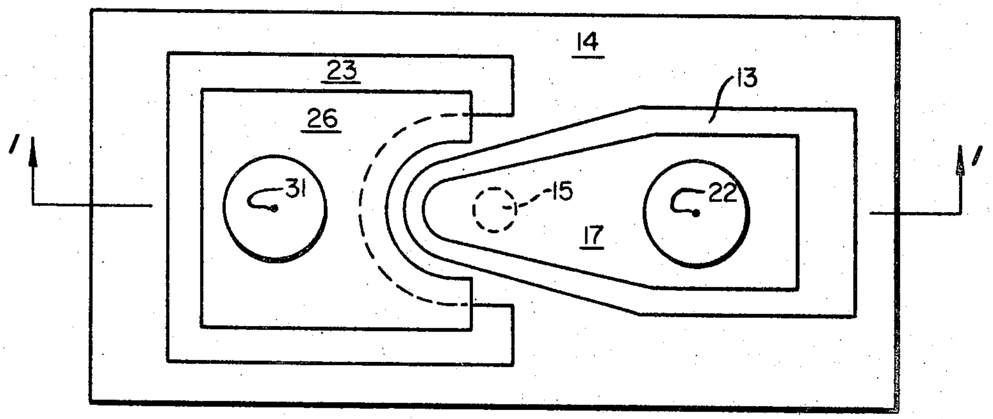
FIG. 2
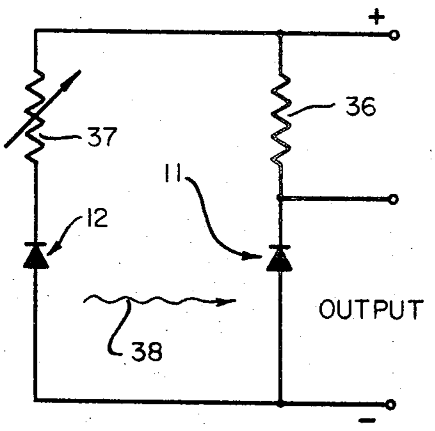
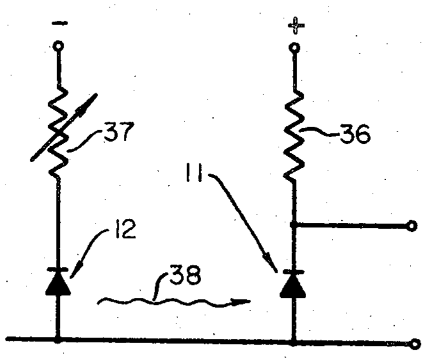
FIG. 8
FIG. 7
INVENTORS
ROLAND H. HAITZ
DAVID FARRINGTON
BY Fleher and Swain
ATTORNEYS

SEMICONDUCTOR DEVICE HAVING CONTROLLABLE NOISE CHARACTERISTICS

Filed Jan. 20, 1966 2 Sheets-Sheet 2

INVENTORS
ROLAND H. HAITZ
DAVID FARRINGTON
BY
Flehr and Swain
ATTORNEYS

United States Patent Office 3,403,306

Patented Sept. 24, 1968

3,403,306

SEMICONDUCTOR DEVICE HAVING CONTROLLABLE NOISE CHARACTERISTICS

Roland H. Haitz, Dallas, Tex., and David Farrington, Palo Alto, Calif., assignors to International Telephone and Telegraph Corporation, Nutley, N.J., a corporation of Maryland Filed Jan. 20, 1966, Ser. No. 521,888
2 Claims. (Cl. 317—235)

ABSTRACT OF THE DISCLOSURE

A semiconductor device that affords greater control over its noise generating characteristics by surrounding a noise producing PN junction with a guard ring having a higher breakdown voltage than said noise junction thereby providing better optical coupling with a photon emitting PN junction within said device. By partially surrounding said photon emitting PN junctions with another guarded ring the efficiency and control of said optical coupling mechanism is further improved.

This invention relates generally to a semiconductor noise device and more particularly to a three-terminal semiconductor noise device.

Avalanche diodes have been used for the generation of high amplitude noise. In such diodes, the avalanche breakdown has occurred within small regions, so-called microplasmas, along the edge of the P-N junction. Generally, the microplasmas have been caused by uncontrollable effects whereby the characteristics of a number of devices cannot be reliably controlled during manufacture. Common practice in the past has been to select the noise diodes from commercially available Zener diodes.

In copending application Ser. No. 505,702, filed Oct. 29, 1965, Patent No. 3,349,298, assigned to the same assignee, there is described an improved noise diode which operates by a combination of field emission and avalanche breakdown and employs a so-called guard ring technique to achieve noise diodes having predictable characteristics.

It is a general object of the present invention to provide a three-terminal noise device having controllable characteristics.

It is another object of the present invention to provide a controlled noise semiconductor device including a noise diode optically coupled to a control diode.

It is a further object of the present invention to provide a noise device in which the pulse rate can be controlled over a wide range.

It is still another object of the present invention to provide a semiconductor noise device in which the noise is relatively independent of temperature.

It is still a further object of the present invention to provide a semiconductor noise device which is capable of operating at relatively high pulse rates.

It is still a further object of the present invention to provide a semiconductor noise device in which the noise pulse rate can be modulated.

The foregoing and other objects of the invention will become more clearly apparent from the following description when taken in conjunction with the accompanying drawings.

Referring to the drawing:

FIGURE 1 is a sectional view taken along the line 1—1 of FIGURE 2 showing one design of semiconductor noise device;

FIGURE 2 is a plan view of the device shown in FIGURE 1;

FIGURE 7 is a circuit diagram schematically illustrating one connection of the semiconductor noise devices shown in FIGURES 1–4; and FIGURE 8 is a circuit diagram schematically illustrating another connection for the semiconductor noise devices shown in FIGURES 1–4.

Figure 3:
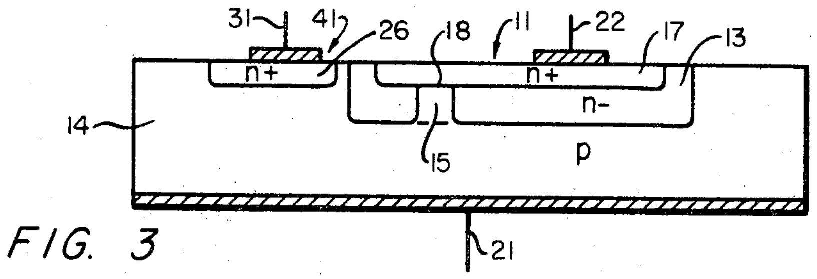
FIGURE 3 is a sectional view taken along the line 3—3 of FIGURE 4 showing another semiconductor noise device.

Generally, the semiconductor noise devices of the present invention include a photon emitting semiconductor diode optically coupled to a noise diode to cause band to band generation of carriers in the noise diode to control the initiation of avalanche breakdown.

Referring to FIGURES 1 and 2, the semiconductor noise device includes a noise diode 11 and a photon emitting diode 12. As will be presently apparaent, diode 11 is of the so-called "guard-ring" type, while diode 12 has a "guarded" structure. The diode 11 may be of the type described in said copending application. It includes a so-called guard-ring 13 of one conductivity type, for example, n-type, diffused deeply into a p-type wafer 14 to form a ring which surrounds upwardly projecting filament 15. The filament extends upwardly towards the upper surface 16. A high impurity concentration region 17 of said one conductivity type is diffused from the upper surface 16 of the wafer. The region 17 forms a transition zone with the n-type guard-ring and forms a rectifying junction 18 with the upwardly extending filament 15. Preferably, the guard-ring 13 has a substantially lower impurity concentration than the region 17 whereby the breakdown voltage of the junction 18 is substantially lower than the breakdown voltage of the p-n junction formed between the regions 13 and 15.

In operation, a voltage is applied between the terminals 21 and 22 which reverse biases the junction 18. As the voltage is increased, the avalanche breakdown voltage of the junction 18 is reached and the diode can breakdown. A diode of this type is described in detail in the copending application referred to above.

According to the present invention, there is provided an additional guarded diode 12. The diode 12 includes a guard region 23 which may, for example, be lowly doped n-type material. This region forms the guard junction 24. A higher impurity concentration region 26 of the same conductivity type forms a transition 27 with region 23 and a junction 28 with the wafer 14. This diode is then biased to provide electron-hole pairs at the junction portion 28. The biasing voltage is applied between terminals 21 and 31.

It is believed that the electron-hole pairs generate photons which travel through the material to the space charge region of the junction 18. It has been found that the noise characteristics of the junction 18 are controlled by varying the current across junction 28. It is believed that this is due to the generation of carriers at the junction 18 by the photons and that these carriers, in turn, initiate avalanche breakdown at the junction 18.

For the case where diode 12 is reverse biased, the guard junction 24 ensures that avalanche current flows and photons are produced only substantially at the junction portion 28.

In operation, a reverse bias voltage is applied between the terminals 21 and 22 to set up a space charge region at the junction 18. Subsequently, a bias voltage is applied between the terminals 21 and 31. The voltage can be a forward bias voltage to provide electron-hole pairs and generate photons. Preferably, a reverse bias voltage is applied across the junction to cause avalanche breakdown. The generated electron-hole pairs give rise to photons. In either case, the photons arrive at the junction 18 and generate carriers to initiate avalanche breakdown.

It has been found that if the distance between the two junctions is less than 200 microns, then the photon coupling between the junctions is high and the breakdown voltage of diode 11 is highly influenced by the junction 28. If the junctions are far enough apart, then considerable avalanche current is required to cause enough optical coupling at the junction 18. This, of course, makes the junction relatively immune to microplasmas of junction 28, temperature, etc. Thus, the influence of microplasma fluctuation can be made small in comparison to the total "emitter" current by increasing the distance between the junctions 18 and 28. To increase the distance too far would require relatively high currents. Thus, the spacing is preferably in the order of 50 to 200 microns. When forward bias of the diode 12 is employed, the pulse rate of diode 11 is higher and more sensitive to the emitter current than when reverse bias is applied to diode 12.

The diffusion of minority carriers from the bulk 14 to the junction 18 is suppressed by the p-n junction surrounding the filament 15 whereby substantially only optical coupling controls operation of the diode 11.

The two connections described above are more clearly illustrated in FIGURES 7 and 8 wherein the diodes 11 and 12 are schematically depicted connected in series with resistors 36 and 37, respectively. In the embodiment of FIGURE 7, the reverse voltage is applied to both the emitting diode and the noise diode and, therefore, a single power supply may be employed. The arrow 38 indicates the photon coupling between the two diodes. The output voltage is derived across the diode 11.

In FIGURE 8, the connection is such as to forward bias the diode 12. Again, there is optical coupling as indicated by the arrow 38 and the output voltage is derived across the diode 11.

Figure 4:
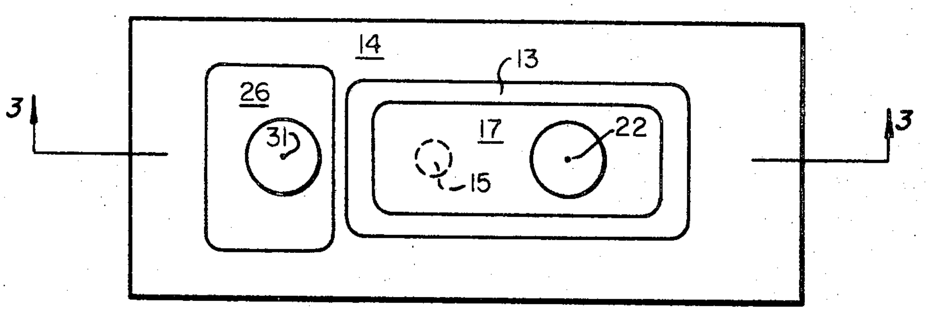
FIGURE 4 is a plan view of the device shown in FIGURE 3.

In FIGURES 3 and 4, there is shown a noise device including an avalanche diode 11 of the type previously described, and a conventional diode 41 that is a diode which does not include a guard-ring to confine the active photon generating area to one surrounding the filament. Like reference numerals are applied to like parts. Such a device is less controllable since the point of photon generation is not localized.

Figure 5:
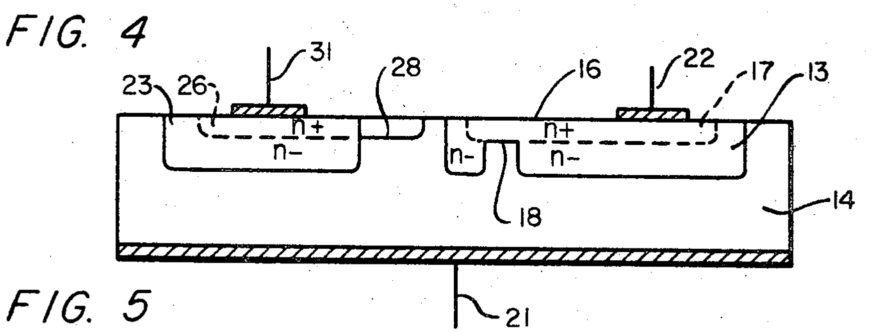
FIGURE 5 is a sectional view taken along the line 5—5 of FIGURE 6 showing another semiconductor noise device incorporating the present invention.
Figure 6:
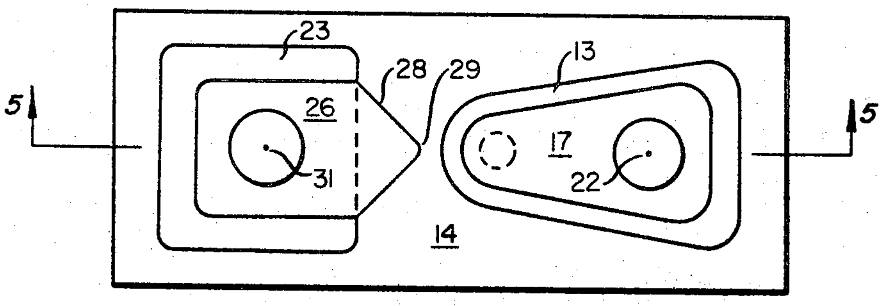
FIGURE 6 is a plan view of the device shown in FIGURE 5.

In FIGURES 5 and 6, there is shown another embodiment of the invention. The photon emitting region is pointed to provide more accurate positioning with respect to the junction 18. Like reference numerals are applied to like parts. Furthermore, the radius of curvature at the tip 29 of junction 28 in FIGURE 6 shall be of the order of $5\mu$ or less in order to cause a localized spherical field distribution within the junction and thus enhance the electrical field in the vicinity of the tip 29. Such a field enhancement will cause a considerable enhancement of the avalanche current density at the tip 29 and thus improve efficiency and control of the optical coupling mechanism.

We claim:

1. A semiconductor device having controllable noise generating characteristics comprising:

a body of semiconductor material of one conductivity type;

a first region of one impurity concentration of opposite conductivity type within said body forming a PN junction between said first region and said body in a limited area;

a second region of lower impurity concentration than said first region and of opposite conductivity type surrounding said first region except for said limited area and surrounding a second PN junction between said second region and said body adjacent to said first junction whereby the breakdown voltage of said first junction is lower than the breakdown voltage of said second junction;

means for applying voltage across said first junction;

a third region of another impurity concentration of said opposite conductivity type within said body forming a third PN junction within said body, said third junction partially surrounding said second region and being optically coupled to said first junction;

means for applying a voltage across said third junction causing the generation of photons at said third junction whereby said photons generate current at said first junction controlling both the initiation of avalanche breakdown at said first junction and the noise generated by said semiconductor device;

and a fourth region of lower impurity concentration than said third region and of opposite conductivity type having a higher breakdown voltage than said third junction, said fourth region partially surrounds said third region.

2. A semiconductor device as in claim 1 wherein the spacing between said first and third junctions is in the range of 50–200 microns.

References Cited

UNITED STATES PATENTS

| | | | |
|---|---|---|---|
| 3,007,090 | 10/1961 | Rutz | 317—235 |
| 3,229,104 | 1/1966 | Rutz | 250—211 |

JOHN W. HUCKERT, *Primary Examiner.*

M. H. EDLOW, *Assistant Examiner.*